United States Patent [19]

Kato

[11] Patent Number: 5,036,541

[45] Date of Patent: Jul. 30, 1991

[54] MODULATION EFFECT DEVICE

[75] Inventor: Mitsumi Kato, Hamamatsu, Japan

[73] Assignee: Yamaha Corporation, Hamamatsu, Japan

[21] Appl. No.: 161,344

[22] Filed: Feb. 19, 1988

[51] Int. Cl.[5] .................... H03G 3/00

[52] U.S. Cl. .................... 381/62; 84/629

[58] Field of Search .................... 381/97, 98, 62; 84/629, 84/706, 740

[56] References Cited

U.S. PATENT DOCUMENTS

| | | | |
|---|---|---|---|
| 4,211,138 | 7/1980 | Deutsch | 84/1.01 |
| 4,219,880 | 8/1980 | Nichols | 381/63 |
| 4,237,343 | 12/1980 | Kurtin et al. | 381/63 |
| 4,267,761 | 5/1981 | Deutsch | 84/1.19 |
| 4,338,581 | 7/1982 | Morgan | 84/1.24 X |
| 4,389,915 | 6/1983 | Bione | 381/63 |

OTHER PUBLICATIONS

Chamberlin, Musical Applications of Microprocessors, 1980, pp. 447–451, 464–465.

Budak, Passive and Active Network Analysis and Synthesis, 1974, p. 443.

Beigel, "A Digital 'Phase-Shifter' for Musical Applications, Using the Bell Labs (Alles-Fischer) Digital Filter Module" Journal of the Audio Engineers Society, vol. 27, No. 9, Sep. 1979.

*Primary Examiner*—Forester W. Isen

*Attorney, Agent, or Firm*—Blakely, Sokoloff, Taylor & Zafman

[57] ABSTRACT

A modulation effect device is implemented by utilizing a fact that a phase or frequency of an output signal from a digital filter can be varied by varying a filter-coefficient according to a lapse of time. A musical tone signal inputted into the digital filter is phase-or frequency-modulated in accordance with the variation of the filter coefficient, thereby imparting such modulation effect as vibrato, chorus or ensemble (symphonic chorus) to the musical tone signal.

18 Claims, 6 Drawing Sheets

(a)

(b)

(c)

(d)

MODULATION EFFECT DEVICE

This is a continuation of application Ser. No. 843,762 filed Mar. 25, 1986, now abandoned, which is a continuation of Ser. No. 649,816 filed Sep. 12, 1984, now abandoned, which is a continuation of Ser. No. 396,390 filed Jun. 8, 1982, now abandoned.

BACKGROUND OF THE INVENTION

This invention relates to a modulation effect device, and more particularly a modulation effect device capable of providing a desired modulation effect by utilizing a digital filter.

Prior art modulation effect device which has been used to apply such modulation effect to a musical tone signal generated from an electronic musical instrument etc. as vibrato, chorus and ensemble (symphonic chorus) is such analogue delay element as a BBD (backet brigade device) or a CCD (charge coupled device) and by modulating the shift clock applied to such a delay element, a phase (frequency)-modulated signal is produced by the delay element.

With the modulation effect device utilizing such analog delay element, however, since the dynamic range for the input signal to the analog delay element is narrow, there are such defects as a poor or small S/N ratio and a large noise. Where the modulation effect device is applied to an electronic musical instrument in which a musical tone signal is converted into a digital code, as the digital musical tone signal is one converted into an analog signal with a D/A converter and then inputted into the modulation effect device, it is necessary for a filter having a sharp cut-off characteristic to follow the D/A converter. Use of such filter not only makes it difficult to fabricate the circuit as an integrated circuit but also makes bulky the circuit.

SUMMARY OF THE INVENTION

It is an object of this invention to provide an improved modulation effect device having a good or large S/N ratio and can be readily fabricated into an integrated circuit.

Another object of this invention is to provide a novel modulation effect device especially suitable for use in an electronic musical instrument.

According to this invention, there is provided a modulation effect device comprising a digital filter which inputs a musical tone signal converted into digital code, it including a multiplier, and a coefficient generator for supplying to the multiplier a multiplication coefficient which varies with time so as to produce a musical tone signal with its phase or frequency modulated in relation to the variation with time of the multiplication coefficient as an output of the digital filter.

DESCRIPTION OF THE PREFERRED EMBODIMENTS

Figure 1:
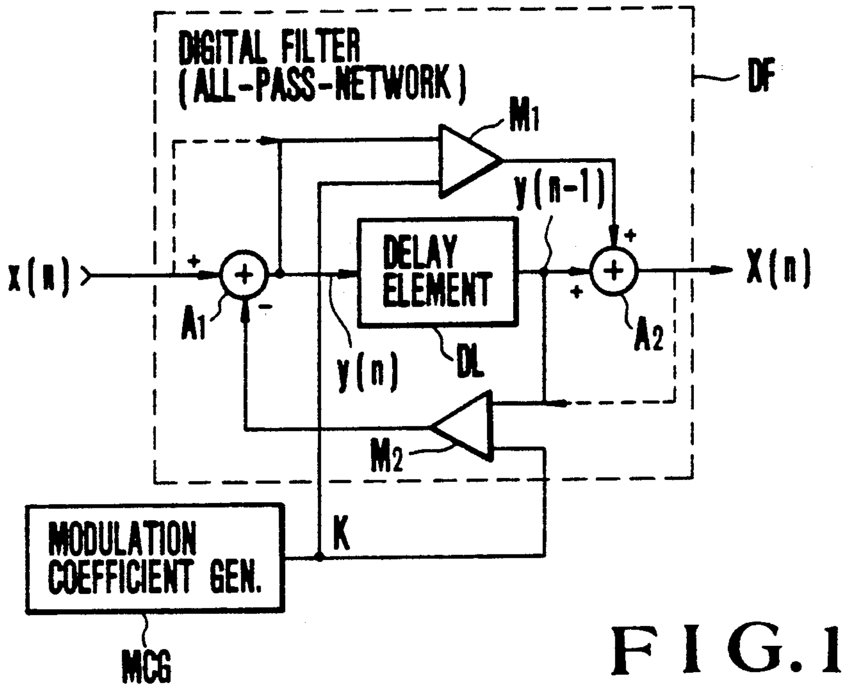
FIG. 1 is a block diagram showing one embodiment of this invention.

One embodiment of this invention shown in FIG. 1 comprises a digital all-pass network (filter), hereafter being called a digital filter DF in a broad sense and a modulation coefficient generator MCG. The digital filter DF includes adders A1 and A2, multipliers M1 and M2, and a delay element DL having a delay time equal to one sampling period to of an input musical tone signal x(n), where n represents numbers 0, 1, 2 ... of the sampling time slots.

The output signal of the delay element DL is applied to one input of the multiplier M2 and multiplied with a modulation coefficient K applied to another input of the multiplier M2. The output of the multiplier M2 is fed back to the subtraction input (−) of the adder A1. To the addition input (+) of the adder A1, the input musical tone signal X(n) is supplied, so that the output signal of the multiplier M2 is subtracted from the musical tone signal X(n) and the remainder is outputted from the adder A1. The output signal of the adder A1 is supplied to one input of the multiplier M1 and multiplied with the modulation coefficient K supplied to another input of the multiplier M1. The output signals of the multiplier M1 and the delay element DL being supplied to the addition inputs (+) of the adder A2, the output signal of this adder A2 is outputted as a musical tone signal X(n) whose phase (frequency) is modulated in relation to a variation with time of the modulation coefficient K generated by the modulation coefficient generator MCG, that is imparted with a modulation effect. In this example, the delay element DL is constituted by a digital memory device, and the modulation coefficient is set to a value of $-1<K<1$.

Denoting the output signal of the adder A1 by y(n), where n=0, 1, 2 . . . , the outputs at various portions can be expressed as follows.

(a) output signal of the delay element DL $=y(n-1)$ (b) output signal of the multiplier M2 $=K\cdot y(n-1)$ (c) output signal of the multiplier M1 $=K\cdot y(n)$ (d) output signal of the adder A2 $=K\cdot y(n)+y(n-1)$ In this case, since the output signal y(n) of the adder A1 can be shown by $$y(n)=x(n)-K\cdot y\,(n-1)$$

the output signal X(n) of the adder A2 can be expressed as follows:

$$\begin{aligned} X(n) &= K\cdot y(n)+y(n-1) \\ &= K\{x(n)-K\cdot y(n-1)\}+y(n-1) \\ &= K\,x(n)+(1-K^2)\cdot y(n-1) \end{aligned} \tag{1}$$

By Z-transforming the above equation (1), the transfer function H(Z) (=Y(Z)/X(Z)) of the circuit shown in FIG. 1 that outputs the output signal X(n) expressed as equation (1) is shown by $$H(Z) = \frac{Z^{-1} - K}{1 - K \cdot Z^{-1}} \quad (2)$$

Consequently, the frequency characteristic $H(e^{j\omega})$ is given by $$H(e^{j\omega}) = \frac{\cos\omega - 2K + K^2 \cdot \cos\omega - j(1 - K^2) \cdot \sin\omega}{1 - 2K \cdot \cos\omega + K^2} \quad (3)$$

Where a signal $x(n)=\cos(\omega O \cdot n)$ is applied as the input musical tone signal x(n), the output signal X(n) of the adder A2 becomes $$X(n) = |H(e^{j\omega_o})| \cos(\omega_o n + \theta) \quad (4)$$

where $$\theta = arg(H(e^{j\omega})) = -\tan \frac{(1 - K^2) \cdot \sin \omega_o}{\cos \omega_o - 2K + K^2 \cdot \cos \omega_o} \quad (5)$$

Since $H(e^{j\omega o})=1$, the output signal X(n) is expressed as follows, $$X(n) = \cos(\omega_o \cdot n + \theta) \quad (6)$$

It is now assumed that $K=k_0.\sin \omega m \cdot n$, that is when the coefficient K is varied with time in accordance with a sine wave signal $K_0.\sin\omega m.n$, the output signal X(n) is expressed by $$X(n) = \cos(\omega 0 \cdot n + \theta(n)) \quad (7)$$

Therefore, x(n+1), X(n+1) is expressed as follows:

$$x(n+1) = \cos[\omega_o \cdot (n+1)$$

$$X(n+1) = \cos[\omega_o \cdot (n+1) + \theta(n+1)$$

Since the varition of phase per unit time corresponds to frequency, the frequencies fx and fy of the input signal x(n) the output signal X(n) may be shown by $$fx = \omega_0 \quad (8)$$

$$fx = \omega_0 + \{\theta(n) - \theta(n-1) \quad (9)$$

Accordingly, it is possible to obtain an output signal X(n) phase-modulated by the coefficient K.

The same digital filter as above-mentioned is performed by changing the wiring of the dotted lines shown in FIG. 1, that is, one input of the multiplier M1 and one input of the multiplier M2 may be connected to the addition input (+) of the adder A1 inplace of the output of the adder A1 and the output of the adder A2 in place of the output of the delay element DL respectively.

Figure 2:
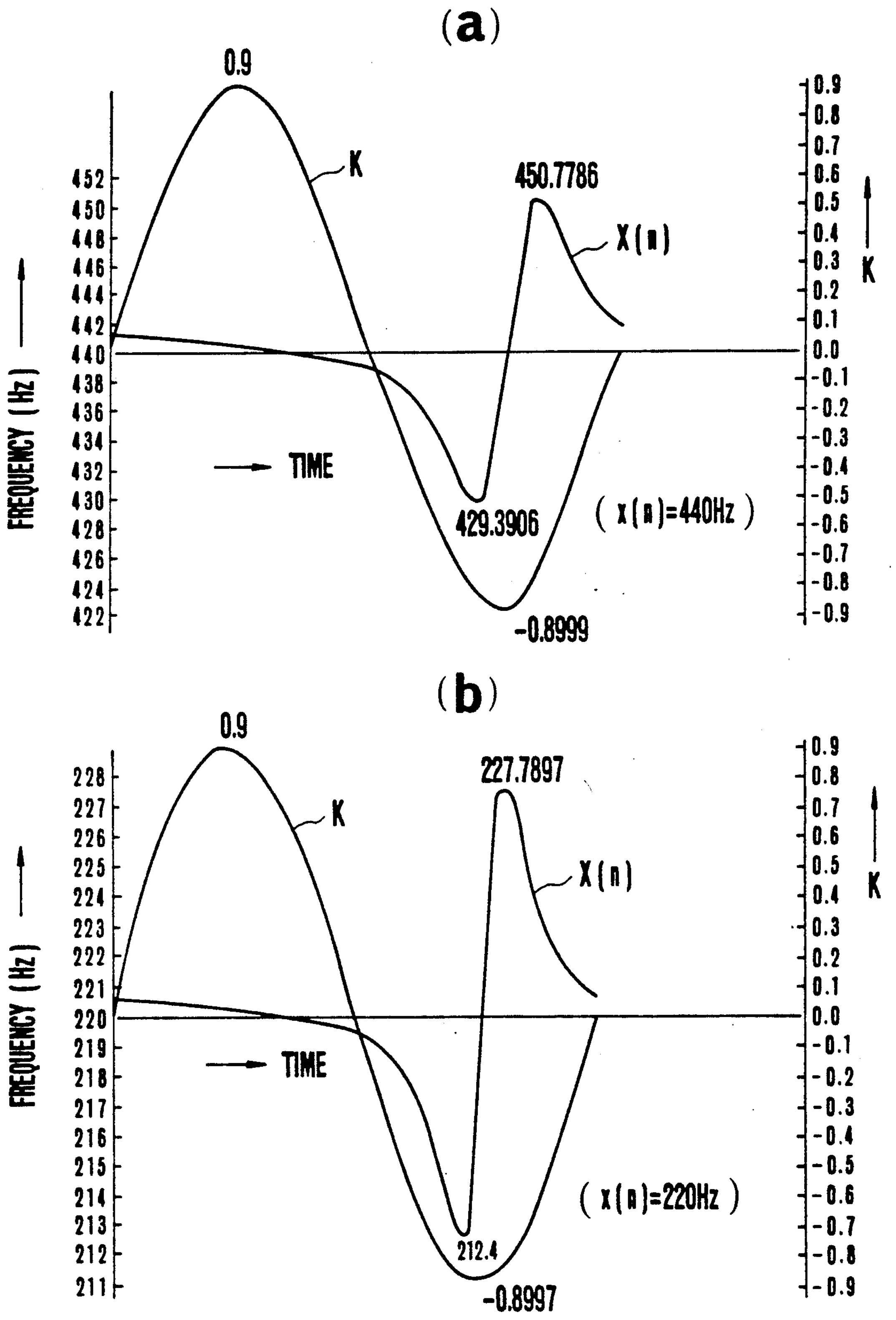
FIG. 2*a* and 2*b* are graphs showing variation in the frequency of an output signal where a multiplification coefficient is varid in the circuit shown in FIG. 1.

FIG. 2*a* is a graph showing the variation in frequency of the output signal X(n) where a coefficient K is 0.9 sin ωmt and a musical tone signal x(n) having a frequency of 440 Hz is inputted. FIG. 2*b* is a graph showing the variation in frequency of the output signal X(n) where a coefficient K is 0.9 sin ω mt and a musical tone signal x(n) having a frequency of 220 Hz is inputted. As can be noted from these figures, it is possible to obtain an output signal X(n) phase-modulated with the coefficient K which varies with time.

Figure 3:
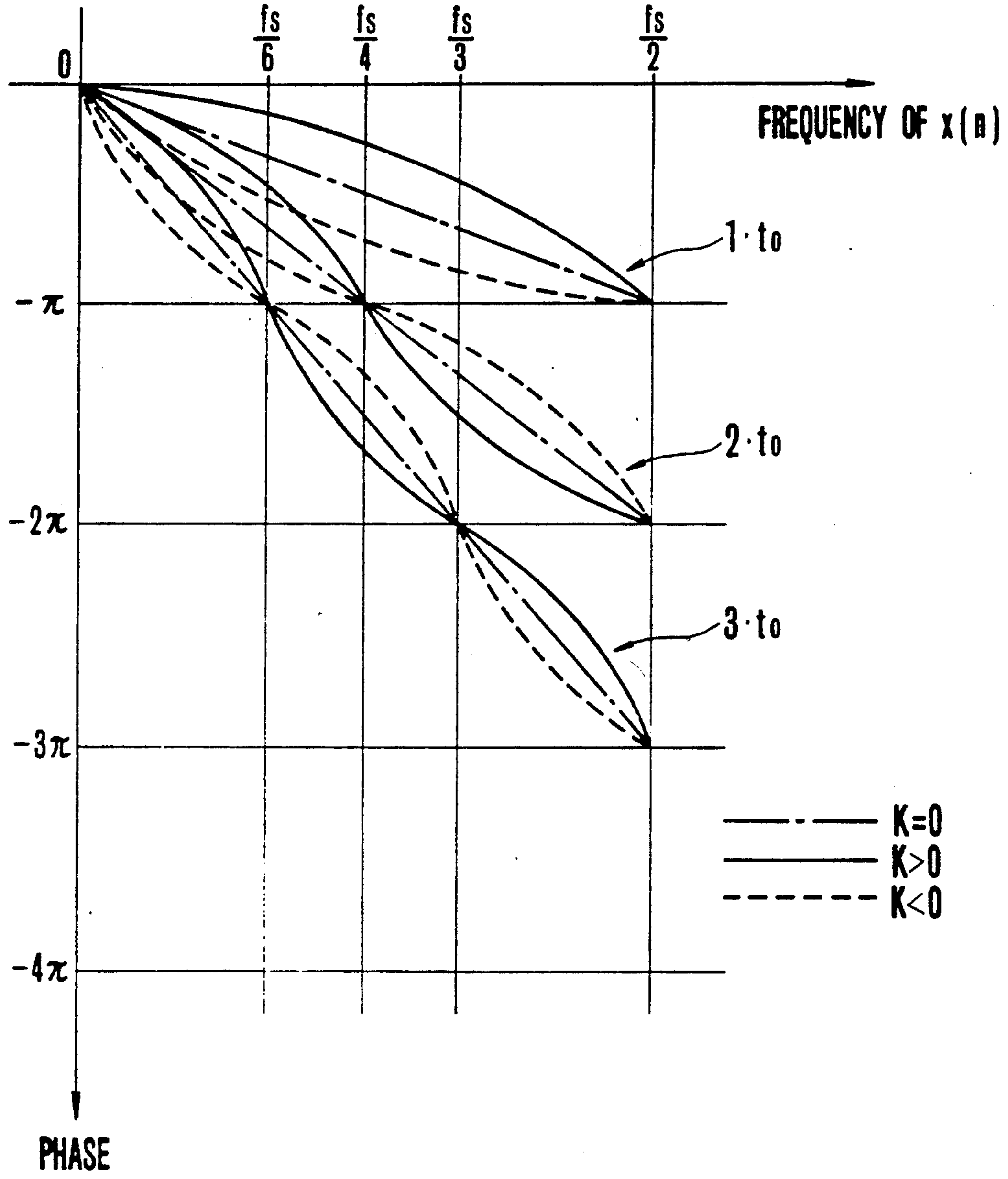
FIG. 3 is a graph showing the relation between the variation in the frequency of the input signal and the variation in the phase of the output signal in the circuit shown in FIG. 1.

FIG. 3 is a graph showing the relation between the frequency of the input signal x(n) and the phase of the output signal X(n) for K=0, K>0 and K<0. FIG. 3 shows three characteristics where the delay time of the delay element is $1 \cdot t_0$, $2 \cdot t_0$ and $3 \cdot t_0$ respectively. In FIG. 3, fs represents the sampling frequency of the input musical tone signal x(n).

Figure 4:
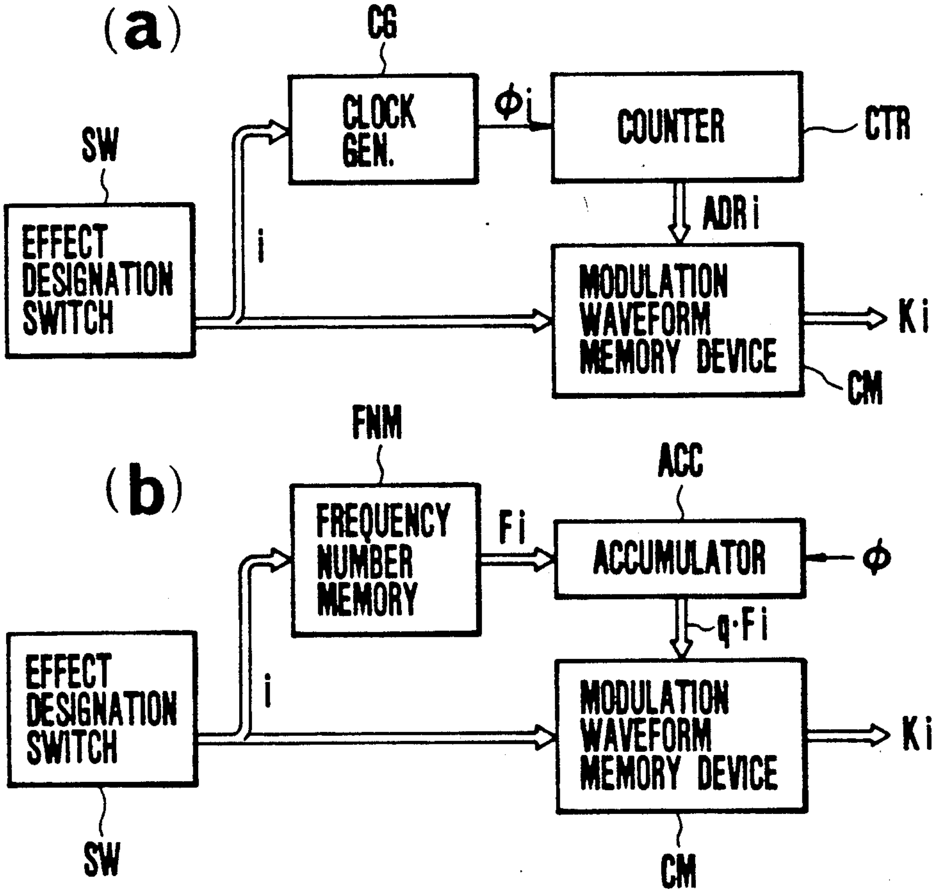
FIGS. 4*a* and 4*b* are block diagrams showing two examples of a modulation coefficient generator.

The modulation coefficient generator MCG for generating the modulation coefficient K has a construction as shown in FIG. 4*a* or 4*b*. In FIG. 4*a*, there are provided a modulation waveform memory device CM which stores predetermined modulation waveforms MWi (i represents the type of the modulation effect) respectively corresponding to a plurality of modulation effects, a clock pulse generator CG which produces a clock pulse φi having a frequency fi corresponding to signals outputted from the effect designation switch SW and representing the type of the modulation effect, and a counter CTR that counts the number of the clock pulses φi which produces a memory address signal ADRi corresponding to the signal i and applied to the modulation waveform memory device CM as a lower order address signal, whereas the signal i is supplied as a upper order address signal (a signal designating the type of the modulation waveform). Thus, it is possible to generate a modulation waveform MWi as the modulation coefficient Ki which varies with time corresponding to the modulation effect designated by the switch SW.

Alternatively, as shown in FIG. 4*b*, the clock generator CG and the counter CTR shown in FIG. 4*a* may be substituted by a frequency number memory device FNM and an accumulator ACC. Thus the frequency number memory device FNM stores the frequency number Fi (numerical data) that determines the frequencies of respective modulation effects and a frequency number Fi corresponding to the type of the modulation effect designated by the switch SW is read out of the memory device FNM for supplying the frequency number to the accumulator ACC. The frequency number Fi is accumulated by the accumulator ACC at a predetermined rate in accordance with the clock pulse φ to form an accumulated value q.Fi (where q=1, 2 . . . ) having a repetition frequency corresponding to the frequency number Fi, the accumulated value q Fi being applied to the modulation waveform memory device CM as a lower order address signal whereby the modulation waveform memory device CM produces the modulation waveform MWi as the modulation coefficient Ki which varies with time corresponding to the modulation effect designated by the switch SW. In this case, a reference modulation waveform may be produced from the memory device and a product obtained by multiplying the reference modulation waveform with a coefficient corresponding to the type of the modulation effect may be used as the modulation coefficient Ki.

Figure 5:
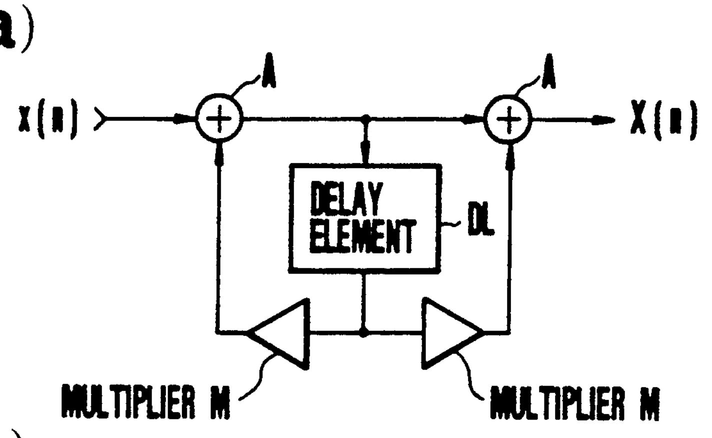
FIGS. 5*a* through 5*d* are block diagrams showing other examples of the digital filter utilized in this invention.
Figure 5:
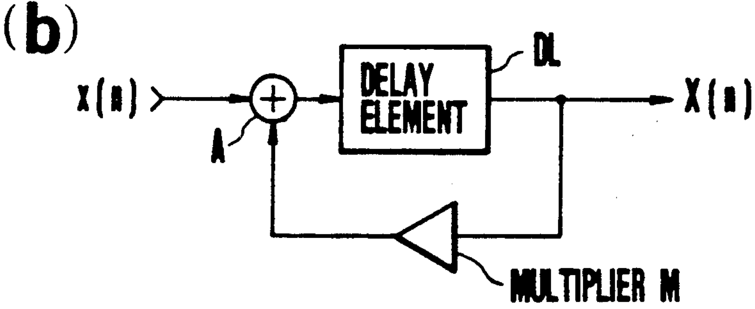
Figure 5:
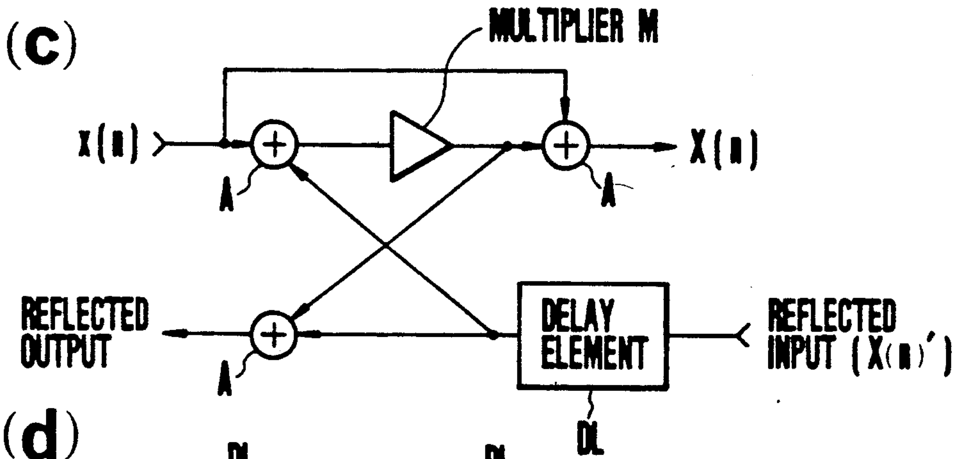
Figure 5:
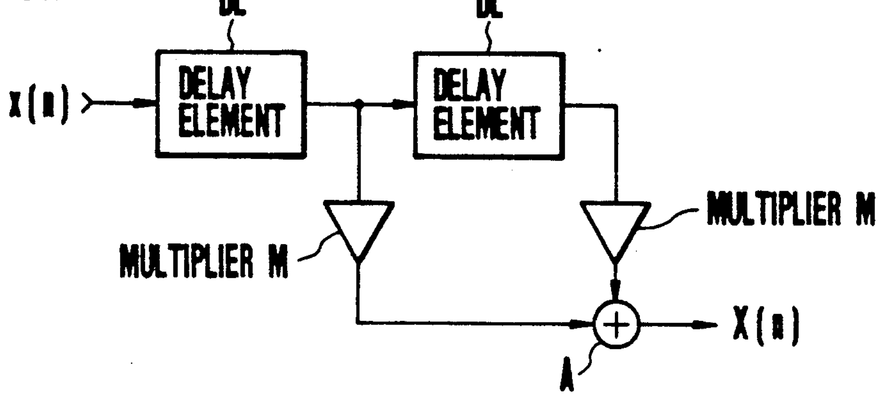

Although in the construction shown in FIG. 1, the digital filter DF is constituted by a first order all-pass network (filter), it may be constituted by an all-pass network (filter) of higher orders. The same effect as in FIG. 1 can also be provided by varying the coefficient of a multiplier M of such digital filter of such basic form of a second order digital filter as shown in FIG. 5*a*, a digital comb filter shown in FIG. 5*b*, a digital lattice filter shown in FIG. 5*c* and a digital transversal filter shown in FIG. 5*d*.

A detail of the construction of the digital filters diagrammatically shown in FIGS. 5a through 5d will be described as follows. Although each digital filter may be constituted by inherent hardware at may be constructed as shown in FIG. 6.

Figure 6:
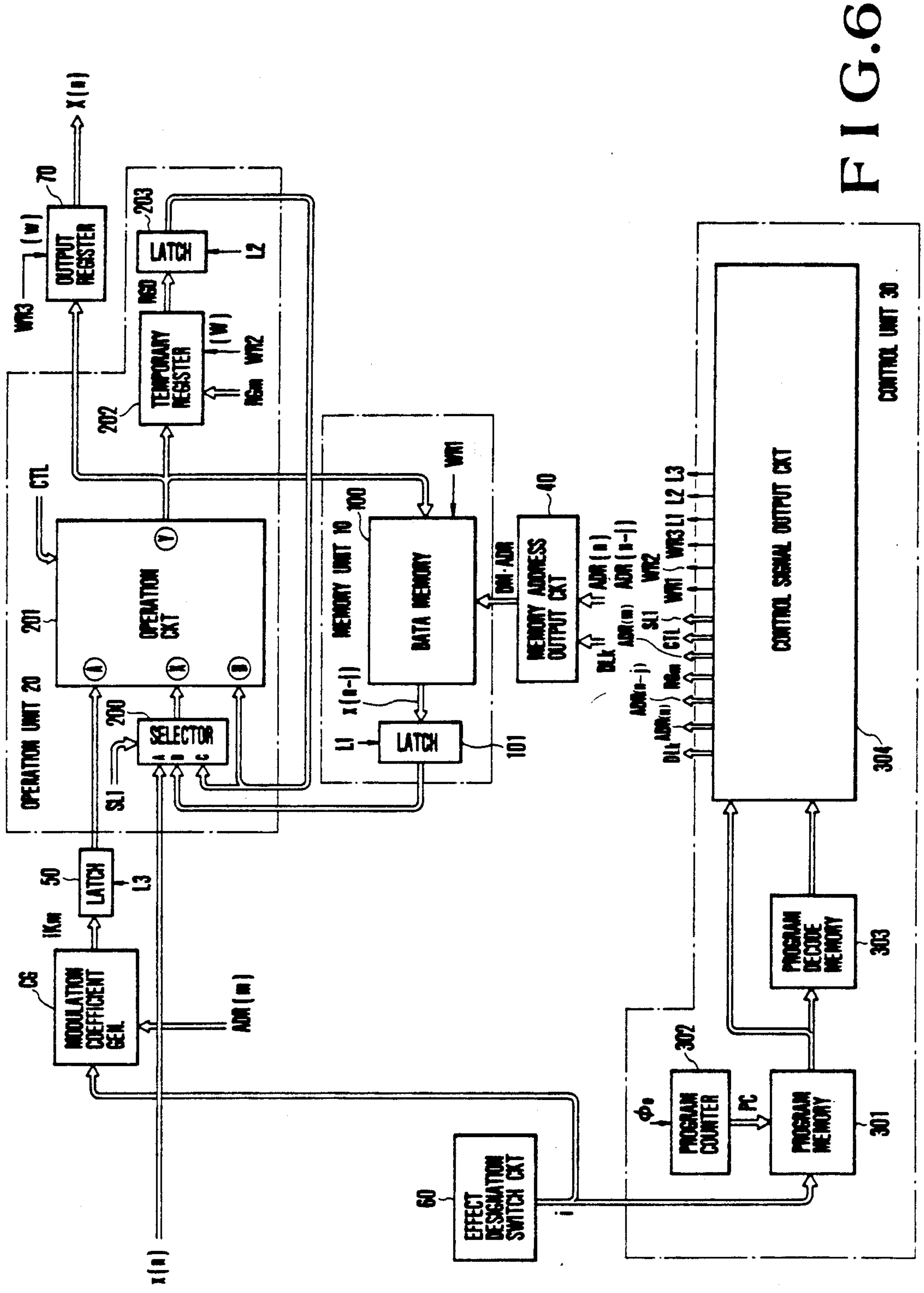
FIG. 6 is a block diagram showing the detail of a digital filter.

FIG. 6 shows a block diagram which can be used to constitute a digital filter DF of any type and comprises a memory unit 10, a operation unit 20, a control unit 30, and a memory address output circuit 40.

The memory unit 10 is a delay element which delays the stored signal by any delay time $j \cdot t_0$ ($j=1, 2 \ldots$) by making one address spacing correspond to a delay time $t_0$ and constituted by a data memory device 100 and a latch circuit 101. In order to read out a signal $x(n-j)$ stored in the data memory device 100 in a sampling time slot $(n-j)$, and in a time slot (n) after a time $j.t_0$, an address spacing $\Delta ADR$ varied in an interval $j.t_0$ is added to or substracted from the present address value ADR (n) and the result of addition or subtraction is applied to the memory device 100. More particularly, where a signal x(n) is stored sequencially from the higher order address to the lower order address of the data memory device, an address value $ADR(n-j)$ before an interval $j.t_0$ is determined by an equation $$ADR(n-j) = ADR(n) + \Delta ADR \quad (10)$$

and used as an address signal of the memory device 100. On the other hand, where the signal x(n) is stored sequentially the lower order address to the higher order address of the data memory device 100, an address value $ADR(n-j)$ before an interval $j.t_0$ is determined by an equation $$ADR(n-j) = ADR(n) - \Delta AR \quad (11)$$

and utilized as an address signal of the memory device 100 whereby it becomes possible to read out signal $x(n-j)$ stored before the interval $j.t_0$ in the present sampling time slot (n). Thus, it is possible to utilize the data memory device 100 as a delay element having any delay time. The address information ADR(n) for writing a signal x (n) in the present sampling time slot and the address information $ADR(n-j)$ for reading out a signal $x(n-j)$ before an interval $j.t_0$ is supplied from the control unit 30 to be described later. In this case, a plurality of delay elements are necessary depending upon the type of the filter so that informations DLk (where $k=0, 1, 2$ corresponding to the number of respective delay elements are supplied as upper order address informations.

The operation unit 20 executes the addition and multiplication operations of the digital filter and comprises a selector 200, an operation circuit 201, a temporary register 202 and a latch circuit 203.

The input musical tone signal x(n) is applied to the input A of the selector 200, a signal $x(n-j)$ read out from the data memory device 100 is supplied to the input B via the latch circuit 101, and the output signal RGD of the temporary register 202 is applied to the input C via a latch circuit 203. Either one of these input signals x(n), $x(n-j)$ and RGD is selected by a selection control signal SL1 outputted from the control unit 30 and then applied to an input $\textcircled{X}$ of the operatin circuit 201.

A modulation coefficient iKm generated by the modulation coefficient generator CG is applied to the input $\textcircled{A}$ of the operation circuit 201 via a latch circuit 50, either one of the output signals x(n), $x(n-j)$ and RGD of the selector 200 is applied to the input $\textcircled{X}$, and the output signal RGD of the temporary register 202 is supplied to the input $\textcircled{B}$ via the latch circuit 203. In accordance with the operation control signal CTL (3 bit construction) outputted from the control unit 30, the operation circuit 201 executes the following operations and supplies its result of operation Y to the temporary register 202, an output register 70 and memory unit 10.

| | |
|---|---|
| $\textcircled{Y} = \textcircled{A} \cdot \textcircled{X} + \textcircled{B}$ | (12-1) |
| $\textcircled{Y} = \textcircled{X} + \textcircled{B}$ | (12-2) |
| $\textcircled{Y} = \textcircled{X}$ | (12-3) |
| $\textcircled{Y} = \textcircled{B}$ | (12-4) |
| $\textcircled{Y} = 0$ | (12-5) |

The purpose of the temporary register 202 is to temporarily store the result of operation of the operation circuit 201, and the temporary register 202 is provided with a plurality of registers $R_o$ through $R_m$ designated by a register number information $RG_m$ outputted from the control unit 30. The output $\textcircled{Y}$ of the operation circuit 201 is written into the register $R_m$ corresponding to an information $R_m$ corresponding to an information $RG_m$ when a write control signal WR2 is made to be "1".

The purpose of the control unit 30 is to produce various control signals for providing a modulation effect designated by an effect designation switch circuit 60. The control unit 30 is constituted by a program memory device 301, a program counter 302, a program decord memory device 303, and a control signal output register 304.

The program memory device 301 prestores a plurality of types of control programs for selectively realizing digital filters of a plurality of types. Which one of the control programs is to be outputted is designated by a designation signal i (plurality of bits) of the modulation effect outputted from the effect designation switch ciruit 60, and the content of the designated control program is sequentially outputted at each step in accordance with an output information PC of the program counter 302 which counts the number of clock pulses $\phi_o$.

In order to complete all processings regarding one digital filter in one sampling time slot ($t_0$) the number of steps of one control program is selected to be less than $4800/25=192$ where the sampling frequency is 25 KHz and the frequency of the master clock pulse $\phi_o$ is 4.8 MHz. The control program of each step contains a number information DLk of the delay element DL, a data writing address information ADR (n), a data read out information $ADR(n-j)$, a register number information $RG_m$, a coefficient read out address information ADR (m), and an operation code OPC comprising a plurality of bits and utilized to control the operation of the operation circuit 201 and writing of the latch circuit. The informations DLK, ADR(n), $ADR(n-j)$, RGm and ADR(m) are outputted as they are through the control signal output register 304, while the operation code OPC is decoded by the program decode memory device 303 into an operation control signal CTL, a selection control signal SL1, a write control signals WR1 through WR3, and a switch control signal L1 through L3 and these decoded signals are outputted from the control signal output register 304.

The information ADR(m) is an address information for reading out mth modulation coefficient iKm of the modulation effect designated by the output information i from the effect designation switch circuit 60 from the coefficient generator CG.

The memory address output circuit 40 outputs address informations DM.ADR for writing and reading an information into and out of the data memory device 100 and the memory number information DLA outputted from the control signal output register 304 is used as a upper order address information and an address information ADR(n) or read out address information ADR(n−j) is added to the lower order of the address information so as to output this one set of informations as an address information DM.ADR.

The modulation coefficient generator CG generates a modulation coefficient iKm corresponding to the modulation effect designated by the effect designation switch circuit 60. The last value of operation is outputted through the output register 70.

The circuits described above operates as follows. It is assumed that the number m of the delay elements DL is 0, that the sum of the adder A1 is temporarily stored in a register $R_0$ having a register number of [0], and that the sum of the adder A2 is temporarily stored in a register R1 having a register number of [1]. Furthermore, it is assumed that the multiplication coefficient of the multiplier $M_1$ is $iK_1$ and that of the multiplier $M_2$ is $-iK_2$.

At first an equation $$y(n)=x(n)-iK_2\cdot y(n-j)$$

is operated by using an input musical tone signal x(n) at a present instant, that y(n−j) before an interval j.$t_0$, and a modulation coefficient $iK_2$. For the purpose of temporarily storing this calculated value y(n) in the register $R_0$, the following steps (1) through (6) are executed.

(1) an address information ADR[2] is applied to the modulation coefficient generator CG and the coefficient $-iK_2$ is read out. At this time, a latch control signal L3 is outputted from the control signal output register 304, and the coefficient $-iK_2$ read out from the modulation coefficient generator CG is latched in the latch circit 50 and supplied to the input Ⓐ of the operation circuit 201.

(2) Then for the purpose of reading out a musical signal y(n−j) before an interval j.$t_0$, an address information DM ADR having a memory number information DLk (k=0) at a upper order and an information ADR(n−j) at a lower order is given to the data memory device 100, whereby the musical tone signal y(n−j) before the interval j.$t_0$ is read out. At this time, a latch control signal L1 is outputted from the control signal output register 304 to latch the musical tone signal y(n−j) in the latch circuit 101.

In this case, the symbol "J" of the musical tone signal y(n−j) is [1] because the delay time of the delay element shown in FIG. 1 is $t_0$.

(3) Then, for the purpose of multiplying the musical tone signal y(n−j) temporarily stored in the latch ciruit 101 with the coefficient $-iK_2$ temporarily stored in the latch circuit 50, the control signal output register 304 outputs a selection control signal SL1 for selectively outputting the input B of the selector 200, and an operation control signal CTL for executing an operation Ⓨ=Ⓐ.Ⓧ.

Thus, the selector 200 supplies the musical tone signal y(n−j to the input Ⓧ of the operation circuit 201. Furthermore, the operation circuit 201 executes the following operation $$Ⓨ=Ⓐ.Ⓧ=-iK_2\cdot y(n-j)$$

(4) For the purpose of temporarily storing the result of operation $$Ⓨ=-iK_2\cdot y(n-j)$$

of the operation circuit 201 in the register $R_o$ of the temporary register 202, the control signal output register 304 outputs a register number information RGm (m=0) and a writing control signal $WR_2$, whereby the result of operation Ⓨ of the operation circuit 201 is temporarily stored in the register $R_0$.

(5) For the purpose of adding the content $-iK_2\cdot y(n-j)$ of the register $R_0$ to the input musical tone signal x(n) at the present time and to restore the sum in the register $R_0$, the content $iK_2\cdot y(n-j)$ of the register $R_0$ is transferred to the latch circuit 203, and thereafter the control signal output register 304 outputs a selection control signal SD1 for selecting an input A of the selector 200 and an operation control signal CTL for executing an operation Ⓨ=Ⓧ+Ⓑ.

Accordingly, the selector 200 supplies the musical tone signal x(n) to the input Ⓧ of the operation circuit 201. furthermore, the operation circuit 201 executes the following operation $$Ⓨ=Ⓧ+Ⓑ=x(n)-iK_2\cdot y(n-j)$$

(6) For the purpose of storing this result of operation Y in the register $R_0$, the control signal output register 04 outputs a register number information RGm (m=0) and a writing control signal $WR_2$, whereby the register $R_0$ stores a result of operation shown by an equation $$y(n)=x(n)-iK_2\cdot y(n-1)$$

Then, the following steps (7) through (14) are executed for the purpose of operating an equation $$X(n)=iK_1\cdot y(n)+y(n-1)$$

and temporarily storing the calculated value X(n) in the register R1 of the temporary register 202 and for outputting the value X(n) via the output register 70. (7) At first, for the purpose of operating $Y(n)\cdot iK_1$, the content $y(n)=x(n)-iK_2\cdot y(n-1)$ of the register $R_o$ is transferred to the latch circuit 203, and then the coefficient $iK_1$ is generated from the modulation coefficient generator CG and latched in the latch circuit L3.

(8) Then the control signal output register 304 outputs a selection control signal SL1 that selects the input C of the selector 200 and an operation control signal CTL that operates an equation Ⓨ=Ⓐ.Ⓧ, whereby the selector 200 selects the output signal y(n) of the latch circuit 203 and applies it to the input Ⓧ of the operation circuit 201 which operates the following equation $$Ⓨ=Ⓐ.Ⓧ=iK_1\cdot y(n)$$

(9) For the purpose of temporarily storing the calculated value Ⓨ in the register $R_1$, the control signal output register 304 produces a register number information RGm (m=1) and a write control signal $WR_2$, whereby the calculated value Ⓨ $=iK_1 \cdot y(n)$ obtained by the operation circuit 201 is stored in the register $R_1$.

(10) In the same manner as in the step 2, a signal $y(n-1)$ is read out for the purpose of adding the content $iK_1 \cdot y(n)$ of the register $R_1$ to a signal $y(n-1)$ before an interval $j, t_0$, and transferred to the latch circuit 101.

(11) After reading out the content $iK_1 \cdot y(n)$ of the register $R_1$ and then transferring it to the latch circuit 203, the control signal output register 304 outputs a selection control signal SL1 utilized to select the B input of the selector 200 and an operation control signal CTL for operating an equation Ⓨ = Ⓧ + Ⓑ, whereby the selector 200 selects the output signal $y(n-1)$ of the latch circuit 101 and applies it to the input Ⓧ of the operation circuit 201 which operates an equation Ⓨ = Ⓧ + Ⓑ $= y(n-1) + ik_1 \cdot y(n)$ This result of calculation is stored in the register $R_1$ in the same manner as in the step (9), whereby the register $R_1$ stores a signal X(n) expressed by an equation $$X(n) = y(n-1) + iK_1 \cdot y(n)$$

(12) For the purpose of outputting the content X(n) of the register $R_1$ via the output register 70, the content X(n) is transferred to the latch circuit 203 and then the control signal output register 304 outputs an operation control signal CTL for operating Ⓨ = Ⓑ, whereby the operation circuit 201 operates an equation Ⓨ = Ⓑ $= X(n) = y(n-1) + iK_1 \cdot y(n)$

(13) Thereafter the writing control signal WR3 is outputted from the control signal output register 304 and the result of calculation Ⓨ of the operation circuit 201 is stored in the output register 70, whereby it sends out an output signal shown by $$X(n) = y(n-1) + iK_1 \cdot y(n)$$

If $iK_1 = iK_2$, an output signal X(n) which is the same as that of equation (1) would be sent out. More particularly, a signal X(n) formed by imparting a modulation effect to the input musical tone signal x(n) is sent out.

(14) Then, the content of the register $R_0$ is written into the data memory device 100 for the purpose of utilizing the content $$y(n) = x(n) - iK_2 \cdot y(n-1)$$

stored in the register $R_0$ in the next sampling time slot (n+1).

Figure 7:
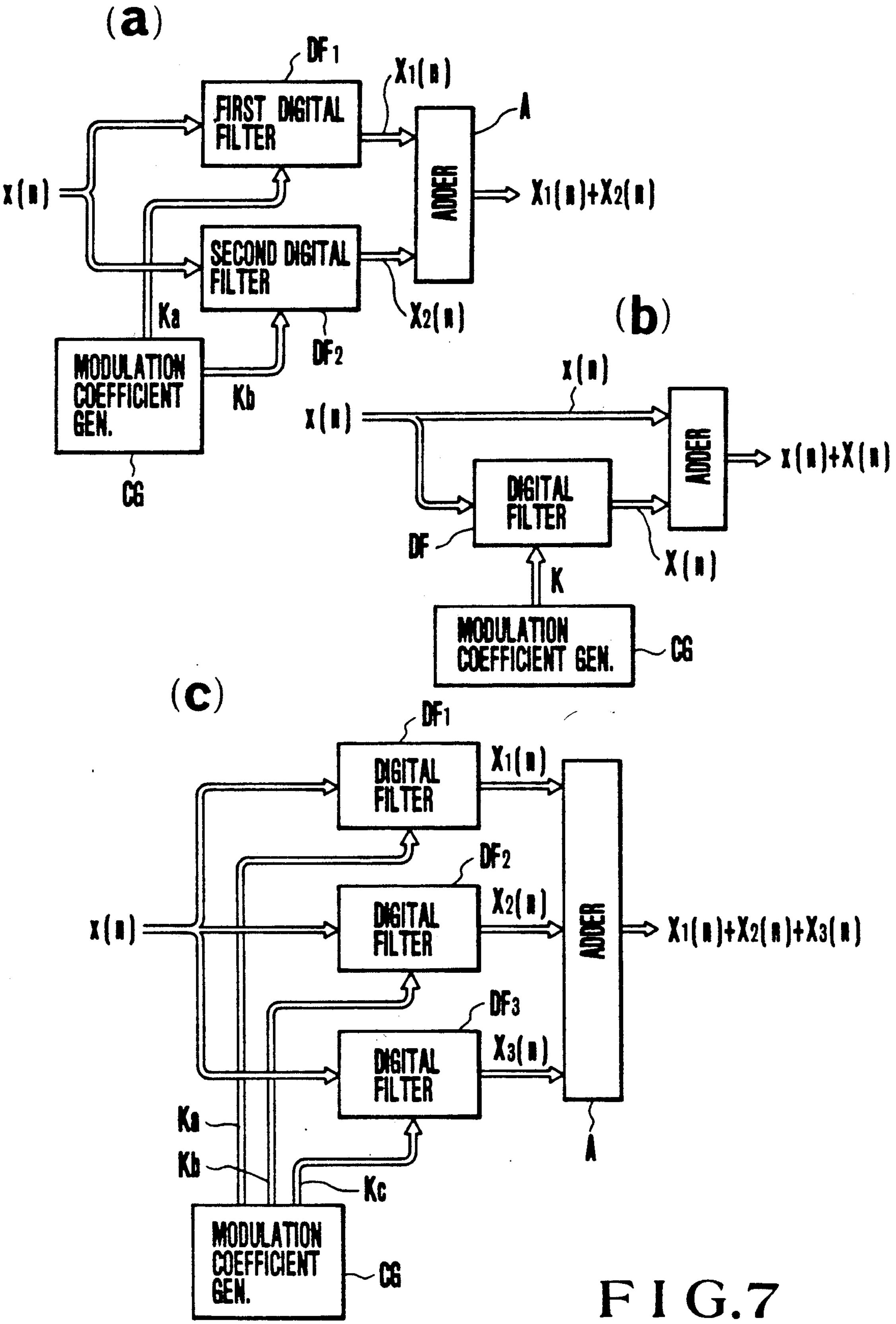
FIGS. 7*a* through 7*c* are block diagrams showing applications of the modulation effect device of this invention.

Thereafter, the steps described above are executed in respective sampling time slots As above described, according to the modulation effect device described in this embodiment, since it is possible to vary as desired the construction of the filter and modulation coefficient according to the control program, it is possible to obtain various types of the modulation effects with the same circuit which is advantageous from the standpoint of versatility and economy. In addition, since a digital memory device is utilized as a delay element it is possible not only to inprove the S/N ratio but also to obtain a modulation effect of good tone quality. Moreover, as it is possible to directly input a musical tone signal converted into a digital code, when the device of this invention is combined with an all digital electronic musical instrument it is not necessary to use any digital-analog converter, analog filter, etc., thus making it possible to fabricate the circuit as an integrated circuit. For example, when incorporating into an electronic musical instrument, two digital filters $DF_1$ and $DF_2$ are provided as shown in FIG. 7*a*, and the modulation coefficients K*a* and K*b* supplied to respective filters $DF_1$ and $DF_2$ are set such that the frequency variations of the output signals $X_1(n)$ and $X_2(n)$ of respective filters $DF_1$ and $DF_2$ will have a phase difference of 180°. When the output signals $X_1(n)$ and $X_2(n)$ of the filters $DF_1$ and $DF_2$ are added together, it is possible to obtain a tremolo effect or a chorus effect. Alternatively, as shown in FIG. 7*b*, a signal X(n) having a phase difference of 180° with respect to the input musical tone signal x(n) may be formed with one digital filter DF and the sum of this signal X(n) and the input musical tone signal x(n) may be outputted.

It is also possible to provide these digital filters $DF_1$, $DF_2$ and $DF_3$ as shown in FIG. 7*c*. In this case where the coefficients Ka, Kb and Kc are set such that the frequency variations of the output signals $X_1(n)$, $K_2(n)$ and $X_3(n)$ of respective digital filters will have a phase difference of 120°, the adder A produces an output signal imparted with an ensemble effect.

As can be noted from the foregoing description, the modulation effect device according to this invention, makes it possible to impart a musical tone signal to be produced to a desired modulation effect by utilizing the fact that the frequency of the output signal can be varied by varying the multiplication coefficient in a digital filter according to a lapse of time For this reason it is possible to readily obtain a modulation effect having an improved S/N ratio. Further, it is also possible to fabricate the circuit as an integrated circuit thus making small the size of the device. Consequently, the modulation effect device of this invention is especially suitable for use in an electronic musical instrument. By the way, the digital filter in this modulation effect device is utilized not to impart reverberation effect to a musical tone but to impart such modulation effect as vibrato. If the digital filter is intended to be used as a reverberation device, it is necessary for the delay element in the digital filter to have long delay-length, for example about 1,000 bits. Only one bit is enough in regard to the delay-length in this invention which uses the digital filter in order to impart the modulation effect.

What is claimed is:

1. A vibrato effect device using an all pass network for an electronic musical instrument comprising:

a musical tone signal generator for generating a musical tone signal having a certain pitch and phase characteristic;

a digital filter connected to said musical tone signal generator for receiving said musical tone signal and for modifying the phase characteristic of said musical tone signal without introducing appreciable attenuation of an amplitude characteristic of said musical tone, said musical tone being represented by simple data which has been converted into digital code, said digital filter having a multiplier for attenuating amplitudes of signals not representative of said musical tone signal and a delay element having a variable delay time; and a coefficient generator for supplying to said multiplier a multiplication coefficient which varies with time and for determining the variable delay time of the delay element thus producing as an output of said digital filter, a musical tone signal with its phase or frequency modulated in relation to the variation with time of said multiplication coefficient.

2. A vibrato effect device as defined in claim I further comprising an adder for adding said musical tone signal generated by said musical tone generator and said musical tone signal of which said phase characteristic is modified by said digital filter.

3. A vibrato effect device as defined in claim 1 further comprising:

another digital filter connected to said musical tone signal generator for receiving said musical tone signal and for modifying phase characteristic of said musical tone signal, said another digital filter comprising a multiplier and a delay element; and an adder for adding said musical tone signal of which said phase characteristic is modified by said digital filter and said musical tone signal of which said phase characteristic is modified by said another digital filer, wherein said coefficient generator supplies to said multiplier of said another digital filter another multiplication coefficient which varies with time.

4. A vibrato effect device as defined in claim 1 wherein said coefficient generator comprises a memory device storing a multiplication coefficient corresponding to a desired vibrato effect, and an address signal generator which forms an address signal that varies with time corresponding to a desired vibrato effect and supplies said address signal to an address input of said memory device.

5. A vibrato effect device as defined in claim 1 wherein said coefficient generator comprises a clock generator for producing a clock, a counter for counting a number of said clocks, a modulation waveform memory device supplied with an address signal from said counter, and an effect designation switch which supplies a signal designating type of a modulation effect to said clock generator and said modulation waveform memory device.

6. A vibrato effect device as defined in claim 1 wherein said coefficient generator comprises a frequency number memory device, an accumulator which accumulates an output signal of said frequency number memory device, a modulation waveform memory device supplied with an accumulated value of said accumulator as an address signal, and an effect designation switch connected to supply an output thereof to said frequency number memory device and said modulation waveform memory device.

7. A vibrato effect device for an electronic musical instrument comprising:

a musical tone signal generator for generating a musical tone signal having a certain pitch and phase characteristic;

a digital low pass filter connected to said musical tone signal generator for receiving said musical tone signal and for modifying phase characteristic of said musical tone signal, said digital filter comprising a multiplier and a delay element having a variable delay time; and a coefficient generator for supplying to said multiplier a multiplication coefficient which varies with time and for determining the variable delay time of the delay element thus producing as an output of said digital filter a musical tone signal with its phase or frequency modulated in relation to the variation with time of said multiplication coefficient.

8. A vibrato effect device as defined in claim 7 wherein said coefficient generator comprises a memory device storing a multiplication coefficient corresponding to a desired vibrato effect, and an address signal generator which forms an address signal that varies with time corresponding to a desired vibrato effect and supplies said address signal to an address input of said memory device.

9. A vibrato effect device as defined in claim 7 wherein said coefficient generator comprises a clock generator for producing a clock, a counter for counting a number of said clocks, a modulation waveform memory device supplied with an address signal from said counter, and an effect designation switch which supplies a signal designating type of a modulation effect to said clock generator and said modulation waveform memory device.

10. A vibrato effect device as defined in claim 7 wherein said coefficient generator comprises a frequency number memory device, an accumulator which accumulates an output signal of said frequency number memory device, a modulation waveform memory device supplied with an accumulated value of said accumulator as an address signal, and an effect designation switch connected to supply an output thereof to said frequency number memory device and said modulation waveform memory device.

11. A vibrate effect device as defined in claim 7 further comprising an adder for adding said musical tone signal generated by said musical tone generator and said musical tone signal of which phase characteristic is modified by said digital low pass filter.

12. A vibrato effect device as defined in claim 7 further comprising:

another digital filter connected to said musical tone signal generator for receiving said musical tone signal and for modifying said phase characteristic of said musical tone signal, said another digital filter comprising a multiplier and a delay element; and an adder for adding said musical tone signal of which said phase characteristic is modified by said digital low pass filter and said musical tone signal of which said phase characteristic is modified by said another digital filter, a digital filter connected to said musical tone said generator for receiving said musical tone signal and for modifying the phase characteristic of said musical tone signal without introducing appreciable attenuation of an amplitude characteristic of said musical tone, said musical tone being represented by simple data which has been converted into digital code, said digital filter having a multiplier for attenuating amplitudes of signals not representative of said musical tone signal and a delay element having a variable delay time; and a coefficient generator for supplying to said multiplier a multiplication coefficient which varies with time and for determining the variable delay time of the delay element thus producing as an output of said digital filter, a musical tone signal with its phase or frequency modulated in relation to the variation with time of said multiplication coefficient.

13. A vibrato effect device for an electronic musical instrument comprising:

a musical tome signal generator for generating a musical tone signal having a certain pitch and phase characterisic;

a digital high pass filter connected to said musical tone signal generator for receiving said musical tone signal and for modifying phase characteristic of said musical tone signal, said digital filter comprising a multiplier and a delay element having a variable delay time; and a coefficient generator for supplying to said multiplier a multiplication coefficient which varies with time and for determining the variable delay time of the delay element thus producing as an output of said digital filter a musical tone signal with its phase or frequency modulated in relation to the variation with time of said multiplication coefficient.

14. A vibrato effect device as defined in claim 13 wherein said coefficient generator comprises a memory device storing a multiplication coefficient corresponding to a desired vibrato effect, and an address signal generator which forms an address signal that varies with time corresponding to a desired vibrato effect and supplies said address signal to an address input of said memory device.

15. A vibrato effect device as defined in claim 13 wherein said coefficient generator comprises a clock generator for producing a clock, a counter for counting a number of said clocks, a modulation waveform memory device supplied with an address signal from said counter, and an effect designation switch which applies a signal designating type of a modulation effect to said clock generator and said modulation waveform memory device.

16. A vibrato effect device as defined in claim 13 wherein said coefficient generator comprises a frequency number memory device, an accumulator which accumulates an output signal of said frequency number memory device, a modulated waveform memory device supplied with an accumulated value of said accumulator as an address signal, and an effect designation switch connected to supply an output thereof to said frequency number memory device and said modulation waveform memory device.

17. A vibrato effect device as defined in claim 13 further comprising an adder for adding said musical tone signal generated by said musical tone generator and said musical tone signal of which said phase characteristic is modified by said digital low pass filter.

18. A vibrato effect device as defined in claim 13 further comprising:

another digital filter connected to said musical tone signal generator for receiving said musical tone signal and for modifying said phase characteristic of said musical tone signal, said another digital filter comprising a multiplier and a delay element; and and an adder for adding said musical tone signal of which said phase characteristic is modified by said digital high pass filter and said musical tone signal of which said phase characteristic is modified by said another digital filter, wherein said coefficient generator supplies to said multiplier of said another digital filter another multiplication coefficient which varies with time.

* * * * *

UNITED STATES PATENT AND TRADEMARK OFFICE
CERTIFICATE OF CORRECTION

PATENT NO. : 5,036,541
DATED : July 30, 1991
INVENTOR(S) : Mitsumi Kato It is certified that error appears in the above-identified patent and that said Letters Patent is hereby corrected as shown below:

Col. 3, line 39, change "$[\omega_0 \bullet (n+1)$" to --$[\omega_0 \bullet (n+1)]$--;
line 41, change "$[\omega_0 \bullet (n+1) + \theta(n+1)$" to --$[\omega_0 \bullet (n+1) + \theta(n+1)]$--;
line 49, change "$\{\theta(n) - \theta(n-1)$" to --$\{\theta(n) - \theta(n-1)\}$--;

Col. 8, line 34, change "register 04" to --register 304--;

Col. 9, line 56, insert --.-- after "slots";

Col. 10, line 32, insert --.-- after "time";

Signed and Sealed this
Fourth Day of July, 1995

Attest:

BRUCE LEHMAN

*Attesting Officer*

*Commissioner of Patents and Trademarks*